United States Patent [19]
Macioch

[11] Patent Number: 5,552,258
[45] Date of Patent: Sep. 3, 1996

[54] DIFFUSION TRANSFER PRINTING PLATE WITH ACID GELATIN UNDER LAYER

[75] Inventor: Michael T. Macioch, Baldwin, Wis.

[73] Assignee: Minnesota Mining and Manufacturing Company, St. Paul, Minn.

[21] Appl. No.: 421,078

[22] Filed: Apr. 13, 1995

[51] Int. Cl.$^6$ .................. G03C 8/52; G03F 7/07
[52] U.S. Cl. ................ 430/204; 430/227; 430/229
[58] Field of Search ................. 430/204, 227, 430/229

[56] References Cited

U.S. PATENT DOCUMENTS

| | | | |
|---|---|---|---|
| 4,510,228 | 4/1985 | Tschai et al. | 430/204 |
| 4,605,609 | 8/1986 | Okazaki et al. | 430/232 |
| 4,606,985 | 8/1986 | Takaya et al. | 430/204 |
| 4,743,525 | 5/1988 | Yamamoto et al. | 430/204 |
| 5,399,457 | 3/1995 | Davies et al. | 430/204 |

OTHER PUBLICATIONS

Glafkides, *Photographic Chemistry*, vol. 1., 1958, Fountain Press, London pp. 280, 291, 293.

*Primary Examiner*—Richard L. Schilling
*Attorney, Agent, or Firm*—Gary L. Griswold; Walter N. Kirn; Mark A. Litman

[57] ABSTRACT

A process is described for producing a lithographic printing plate. The process comprises the steps of imagewise exposing a single sheet lithographic plate material consisting of a flexible support, having thereon a) at least an underlayer containing an acid ossein gelatin, b) a light sensitive silver halide layer, and c) a physical development nucleating surface layer, and, after said exposing, processing said plate material in a diffusion transfer developer or alkaline activator solution to develop imaged portions as hydrophilic areas and retain non-exposed areas as oleophilic areas on said plate.

13 Claims, No Drawings

DIFFUSION TRANSFER PRINTING PLATE WITH ACID GELATIN UNDER LAYER

BACKGROUND OF THE INVENTION

1. Field of the Invention

This invention relates to a lithographic printing plate developed by the silver complex diffusion transfer process. In particular, this invention relates to lithographic printing plates wherein an antihalation layer contains an acid ossein gelatin having a high bloom strength (i.e., high jelly strength) and/or low viscosity to increase the number of impressions the plate can produce.

2. Background of the Art

The present invention relates to a single sheet printing plate construction comprising a support, on which an antihalation layer, an emulsion layer and a physical nucleating receptor layer are provided. Following imagewise exposure, the plate is processed in a diffusion transfer (DTR) developer. The exposed area develops out as a black silver image, while the unexposed silver halide subsequently diffuses through to the receptor element. Physical development nuclei in the receptor layer reduces the silver halide and, in the presence of a toning agent such as 1-phenyl-5-mercaptotetrazole, forms an oleophilic silver complex.

As described in various embodiments, e.g., U.S. Pat. No. 3,728,114, U.S. Pat. No. 4,160,670 and U.S. Pat. No. 4,361,635, such a process can function as a lithographic printing plate due to the oleophilic nature of the complexed silver in the receptor layer and the hydrophilic developed silver image in the emulsion layer. With respect to the emulsion and antihalation layers, gelatin is the preferred medium, in particular, limed-treated inert ossein gelatin. To achieve acceptable abrasion resistance for running on a printing press, the gelatin has to be sufficiently hardened. However, even with excess quantities of hardener such as formaldehyde, the number of impressions this type of lithographic plate can make is limited. Furthermore, small amounts of hydroquinone developer that is incorporated into the printing plate to optimize diffusion transfer development interferes with the crosslinking process, thus reducing hardness and therefore lowering the run length.

U.S. Pat. No. 4,510,228 describes a diffusion transfer plate construction wherein all the gelatin containing layers have a pH below the isoelectronic point(pI) of the gelatin in each layer. Also, the preferred gelatin is time treated (column 3, lines 64–68).

U.S. Pat. No. 4,605,609 describes a low calcium/high bloom strength gel in the image receiving layer of a duplicating paper processed by the diffusion transfer process. However, it is well known in the art, and referenced in U.S. Pat. No. 3,728,114, that a hydrophilic colloid in the image receiving layer will inhibit the oleophilic function of the transferred image in DTR printing plate applications.

U.S. Pat. No. 4,606,985 claims a DTR printing plate wherein at least one gelatin layer contains between 3–30% of a low molecular weight gelatin. An especially preferred combination of gels in the underlayer of the plate construction is an acid treated gelatin and a low molecular weight gel (column 3, lines 50–54). However, no reference is made as to the viscosity of the acid treated gelatin, and that acid-treated gelatin was shown in examples to suffer from blinding and scumming in the absence of low molecular weight gelatin.

U.S. Pat. No. 4,743,525 describes a DTR printing plate having improved printing endurance, wherein the antihalation (AH) and emulsion layers contain a limed treated gelatin having a calcium concentration of 1,000 ppm or less. While the present invention uses gelatins having a calcium level of around 200 ppm, U.S. Pat No. 4,743,525 states that improved run length cannot be achieved with acid treated gelatins (column 2, lines 60–63).

SUMMARY OF THE INVENTION

This invention relates to the composition of a lithographic printing plate processed by the diffusion transfer process. As will be shown in the examples, replacing conventional inert limed treated ossein gelatin with acid gelatin of low viscosity, and most preferably acid ossein gelatin having a defined range of viscosity and bloom strength increases hardness of the printing plate, and consequently increases the run length of the developed plate.

DETAILED DESCRIPTION OF THE INVENTION

This invention provides a method for making a lithographic printing plate which performs with consistent quality throughout the life of the developing solution. The process is accomplished by imagewise exposing a single sheet lithographic plate material consisting of a flexible support, having thereon at least an underlayer containing an acid gelatin having low viscosity (lower than 40 cps at 60° C. at 6 ⅔% weight/weight gelatin to aqueous carrier) and most preferably an acid ossein gelatin, a light sensitive silver halide layer and a physical development nucleating surface layer, and processing said plate material in a diffusion transfer developer or alkaline activator solution, wherein imaged portions develop out as hydrophilic areas and oleophilic areas represent the non-imaged portions of said plate material. The term "single sheet" lithographic plate material means that the support, silver halide emulsion layer, and physical development layer are not stripped or readily strippable from each other during the imaging and use of the lithographic plate.

In the present invention it has been found to be an improvement in such DTR printing plates to use as the binder in an underlayer of the DTR plate an acid ossein gelatin having a viscosity (at 6 ⅔% weight/weight gelatin and aqueous carrier liquid) of less than 40 and more preferably of greater than 20 and less than 40 cps at 60 degrees Celsius (at 6 ⅔% weight/weight gelatin/water). It is also desirable to have the native pH of the acid ossein gelatin (after acid treatment) above 6.9, preferably above 7.0, more preferably above 7.1, and most preferably above 7.2. It is also preferred to have the bloom strength (measured in grams) between 150 and 350.

The flexible support according to this invention may be paper, alpha-olefin polymer (polyethylene, polypropylene, etc.) coated paper, films such as cellulose acetate, polypropylene, polystyrene, polycarbonate, polyvinyl acetal, polyethylene terephthalate, composite films, metals, metalised paper, or metal/paper laminates.

It is preferred in DTR processed priming plate constructions to have a backside coat and at least an undercoat layer on the faceside of said support, these coatings or layers usually consisting of a hydrophilic polymer, which may also contain dyes or pigments to provide antihalation, conductive materials to reduce static effects or impart certain physical characteristics such as low curl or a colored appearance. The preferred hydrophilic polymer is an acid ossein gelatin, especially an acid ossein gelatin having at least a high bloom strength and/or low viscosity, and which gelatin may be combined with hydrophilic binders such as starch, albumin, sodium alginate, hydroxyalkylcellulose, gum arabic, polyvinyl alcohol, polyvinyl pyrrolidone, carboxymethylcellulose, polyacrylamide or copolymers of styrene-maleic anhydride or polyvinyl methyl ether/maleic anhydride. The preferred anti-halation pigment in the undercoat layer is carbon black, although other dyes or pigments that absorb at the wavelength of the imaging light source may also be used. When combined with other hydrophilic binders, the acid ossein gelatin should constitute at least 25% by weight, preferably at least 40% by weight, more preferably at least 60% by weight and still more preferably at least 80% by weight of all hydrophilic binders up to 100% by weight of all hydrophilic binders within the layer.

Included in both the backside and face-side underlayer may be coating aids such as surfactants, antistatic agents, matting agents, anti-tacking agents and hardening compounds for said hydrophilic binder.

Examples of surfactants include non-ionic surface active agents such as saponin, alkylene oxide derivatives, glycidol derivatives, fatty acid esters of polyhydric alcohols and alkyl esters of sugars, anionic surface active agents having an acidic group such as carboxyl, sulfo, phospho, sulfuric acid ester, sulphonamide or phosphoric acid ester group, cationic surface active agents such as amino acids, aminoalkylsulfonic acids, aminosulfonic or phosphoric acid esters, alkylbetaines, amine oxides, alkylamine salts, aliphatic or aromatic quaternary ammonium or phosphoric salts, heterocyclic quaternary ammonium and aliphatic or heterocyclic ring-containing phosphonium or sulfonium salts. The matting agent may include silica, colloidal silica, glass powder, polymeric particulates (e.g., polymethylmethacrylate) or starch powder.

The hardening agents may include organic and/or inorganic compounds for example: chromium or aluminum salts, aldehydes, N-methylol compounds, dioxane derivatives, active vinyl compounds such as triacryloylhexahydro-S-triazines or vinylsulfones, active halogen compounds such as dichlorohydroxy-S-triazines, or mucohalogenic acids.

Such examples of additives as described above may also be be utilized in the light sensitive silver halide layer.

The silver halide used in this invention may consist of silver chloride, silver bromide, silver iodide, silver chlorobromide, silver bromoiodide, silver iodobromochloride or mixtures thereof. Included in the silver halide are dopants from Group VIII of the Periodic Table, such as rhodium, ruthenium, iridium or mixtures thereof in the range of $10^{-3}$ to $10^{-8}$ mole per mole of silver. The crystalline form of the silver halide may be monodispersed or polydispersed and may also be of the core-shell or tablet (tabular or high aspect ratio grains) type grains. The preferred embodiment of the present invention is a 0.2–0.3 micron ruthenium and iridium doped monodispersed silver chlorobromide emulsion containing at least 60% chloride.

These emulsions can be chemically sensitized by known methods, for example alone or in combination with: sulfur sensitization as described in U.S. Pat. Nos. 1,574,944, 2,278,947, 2,410,689, 3,189,458 or 3,501,313; gold sensitization as disclosed in U.S. Pat. Nos. 2,597,856, 2,597,915 or 2,399,083; reduction sensitization as described in U.S. Pat. Nos. 2,518,698, 2,521,925, 2,487,850 or 2,6694,637. The photographic emulsions used in the present invention may be further sensitized with quaternary ammonium or phosphonium salts, thioether compounds, polyethylene oxide derivatives or diketones as disclosed in U.S. Pat. Nos. 2,708,162, 3,046,132, 3,046,133, 3,046,134 or 3,046,135.

The photographic emulsion of the present invention may be spectrally sensitized to any wavelength in either the visible or infrared portion of the electromagnetic spectrum by methods known to those skilled in the art. Examples of spectral sensitizers used in the present invention may include cyanine, merocyanine or other sensitizing dyes.

The photographic emulsion layer may contain various compounds to prevent fogging of the light sensitive material of the present invention during preparation, storage or during processing. Such antifoggants and stabilizers may include azoles such as benzothiazolium salts, nitroindazoles, triazoles and benzimidazoles; heterocyclic mercapto compounds such as mercaptothiazoles, mercaptobenzothiazoles, mercaptobenzimidazoles, mercaptothiadiazoles or mercaptopyrimidines; thioketo compounds such as oxazolinthion; azaindenes such as tetraazindenes; benzenethiosulfonic acids or benzenesulfinic acids.

The receptor layer provided above said emulsion layer contains physical development nuclei, which may be fine particles of metals such as silver, bismuth, antimony, cadmium, cobalt, lead, nickel, palladium, rhodium, gold, platinum, iron, etc., or sulfides, polysulfides or selenides of these metals, or mixtures thereof. The receptor layer may also contain adjuvants such as binders, coating aids, antistatic compounds, hardeners, etc. similar to the examples described in the other coated layers.

As mentioned previously, to differentiate the oleophilic from hydrophilic areas of the plate material, the diffusion transfer process requires an extremely active chemistry that can fully develop out the imaged areas before the silver halide solvent can take effect. One way to increase activity is to increase the alkalinity of the chemistry. However, under such highly alkaline conditions, the developing agent and electron transfer agent may undergo rapid oxidation, thereby adversely affecting image quality and significantly reducing chemistry life. These limitations may be overcome by incorporating the developing agents into the lithographic plate, and subsequently processing in an alkaline activator solution, as described in U.S. Pat. No. 4,362,811. Even when processed in a developer it may still be desirable to include small quantities of developing agent and electron transfer agent to the printing plate to provide optimum transfer development. Developing agents may include polyhydroxybenzenes, such as hydroquinone and electron transfer agents such as 1-phenyl-3-pyrazolidone. The processing solution may also contain water soluble alkali metal hydroxides, such as sodium or potassium hydroxide; a toning or complexing agent such as a mercaptotetrazole, mercaptothiazole or mercaptothiazoline; a silver halide solvent such as thiocyanate, aminoalkanols or thiosulfate and an anti-oxidant such as sodium or potassium sulfite. Other additives may include development accelerators such as polyoxyalkylenes or quaternary ammonium salts, antifoggants such as potassium bromide and thickening agents such as carboxymethylcellulose. As previously noted with respect to U.S. Pat. No. 4,510,228 in which the gelatin layers are coated at a pH lower than their isoelectric point, the acid ossein gelatins used in the present invention have pI values of around 7.0, and such gelatin layers may be coated at a pH of 7.2 or higher. The following non-limiting examples further illustrate this invention.

EXAMPLE 1

Pseudo antihalation underlayer coatings were made to compare different gelatins by coating various compositions on a clear gelatin-subbed 4 mil. (0.01 mm) polyester support as follows:

The coated layer consisted of an aqueous carbon black dispersion 0.912 g/m$^2$, gelatin 3.009 g/m$^2$, polymer (in all cases the polymer is a butylacrylamide copolymer) 0.16 g/m$^2$ and formaldehyde 0.0584 g/m$^2$.

Samples were conditioned by incubating for 24 hours at 50° C. to accelerate and produce uniform hardness values of the coatings.

Coating evaluation was completed on a weighted pressure scribing device producing a hardness value of resistance before penetration into the coated layer. Higher hardness values are associated with improved run length on a printing press.

| Sample # | Hardness | Gelatin Type | Bloom | pI | Viscosity |
|---|---|---|---|---|---|
| 1 | 410 | Acid ossein | 301 | 7.0 | 34 |
| 2 | 385 | Acid ossein | 295 | 7.0 | 33 |
| 3 | 365 | Acid ossein | 296 | 7.1 | 40 |
| 4 | 275 | Acid ossein | 270 | 7.1 | 31 |
| 5 | 188 | Acid ossein | 172 | 6.9 | 22 |
| 6 | 245 | Deionized limed ossein | 252 | 4.9 | 51 |

Higher hardness values on samples #1,2,3 are correlated to the bloom strength and viscosity of the acid ossein gelatins compared to the normal deionized inert limed ossein of sample 6. It can be seen that the preferred acid ossein gelatin used in the practice of the present invention displays a viscosity of less than 40 (and generally above 20 although that limit has not been found to be critical) and has an isoelectric point of at least 6.5 and preferably 6.9 or greater.

Deionized limed ossein gelatin is recommended for photographic emulsion work where an empty or bulking gelatin is required. Acid ossein having a higher purity than acid pigskin is recommended as a supercoat gelatin because of better gloss and lower reswell properties in processing solutions.

EXAMPLE 2

A lithographic plate was made by applying a coating of the following composition on a clear gel subbed 4 mil. (0.01 mm) polyester support:

an underlayer consisting of an aqueous carbon black dispersion (0.82 g/m$^2$), inert deionized limed ossein gelatin (2.69 g/m$^2$) from Example 1 sample #6, containing hydroquinone (0.218 g/m$^2$), phenidone (0.006 g/m$^2$), silica (0.67 g/m$^2$), polymer (0.72 g/m$^2$) and formaldehyde (0.197 g/m$^2$);

a red sensitized layer containing a ruthenium/iridium doped 70:30 mole% chlorobromide emulsion having an average grain size of 0.3 microns coated at 0.7 g/m$^2$ silver, inert gelatin (1.37 g/m$^2$), various coating aids, hydroquinone (0.07 g/m$^2$), phenidone (0.002 g/m$^2$) and formaldehyde (0.063 g/m$^2$); a topcoat containing palladium solution (0.001 g/m$^2$), various coating aids and a dialdehyde starch (0.041 g/m$^2$).

A second lithographic plate was made as above substituting the underlayer gelatin with Example 1 sample #1 acid ossein gelatin.

After 24 hours incubation at 50° C., the coatings were exposed on a 633 nm Linotype Linotronic™ 330 imagesetter and then processed in an alkaline activator solution, followed by neutralization in 3M Onyx™ stabilizer bath.

| Alkaline Activator Solution | |
|---|---|
| Sodium sulfite | 42.5 g |
| Potassium hydroxide | 40.0 g |
| Sodium thiocyanate | 2.0 g |
| Trisodium phosphate | 0.2 g |
| Benzotriazole | 0.8 g |
| 1-phenyl-5-mercaptotetrazole | 0.12 g |
| Water to 1 Kilogram | |

The resulting replicate plate samples were mounted and evaluated for wettability on a Heidelberg GTO printing press using A.B.Dick 3-3109 Magnetic Black ink:

The acid ossein plate had 0.586 units (21%) improved plate wettability on the printing press as compared to the deionized inert limed ossein gelatin plate.

Plate wetting is defined as the ability of the plate to carry water on a printing press and is beneficial for clean image backgrounds. If the amount of water can be held low, there is less possibility for it to mix in together with the ink, emulsifying and eventually causing the plate to become blind. This may also be considered as press latitude.

Additionally as in Example 1, the hardness values of the lithographic printing plates were analyzed with the following results:

The acid ossein gelatin plate was 21.4 units (28.5%) better in hardness than the deionized limed ossein gelatin plate.

EXAMPLE 3

According to the method outlined in Example 2, the image wear or run length response was statistically analyzed on a Heidelberg GTO printing press.

The acid ossein gelatin replacement of the deionized limed ossein gelatin in the underlayer provided a significant 0.556 unit (21.7%) improvement of press wear.

Another way to evaluate the press wear response is a stress test method consisting of mounting the printing plates on a Heidelberg GTO press, running 25–250 sheets in the normal fashion for roll-up numbers, reversing the blanket so the rough texture is exposed and running 1000 sheets, and then reversing the blanket back to the normal position and running an additional 250 copies for a press wear evaluation. This simulates extreme abrasive and adhesion wear on the plate sample and relates to a normal press run of 10–20,000 copies utilizing an abrasive magnetic ink or a rough textured paper. All tests are replicated and run with known good and bad history performance press controls.

EXAMPLE 4

According to the method outlined in Example 2 and the gelatins used in Example 1, the following responses were analyzed at two different underlayer solution pH's. Natural underlayer coating pH of the deionized limed ossein gelatin is about 5.8 and the acid ossein is about 7.2.

| Sample # | Hardness | Gelatin Type | Bloom | Image Wear | Underlayer pH |
|---|---|---|---|---|---|
| 1 | 79.5 | Acid ossein | 301 | 2.6 | 7.2 |
| 2 | 84 | Acid ossein | 295 | 3.6 | 7.2 |
| 3 | 75 | Acid ossein | 296 | 4.1 | 7.2 |
| 4 | 80.3 | Acid ossein | 270 | 3.8 | 7.2 |
| 5 | 67.5 | Acid ossein | 172 | 3.8 | 7.2 |
| 6 | 72 | Deionized limed | 252 | 4.1 | 7.2 |

-continued

| Sample # | Hardness | Gelatin Type | Bloom | Image Wear | Underlayer pH |
|---|---|---|---|---|---|
| 1 | 81 | Acid ossein | 301 | 3.1 | 5.8 |
| 2 | 81.8 | Acid ossein | 295 | 3.3 | 5.8 |
| 3 | 81.8 | Acid ossein | 296 | 2.9 | 5.8 |
| 4 | 75.8 | Acid ossein | 270 | 2.9 | 5.8 |
| 5 | 63 | Acid ossein | 172 | 3.3 | 5.8 |
| 6 | 68.3 | Deionized limed ossein | 252 | 3.8 | 5.8 |

The hardness values are on a relative scale of 1–5, with 1 being the best.

Hardness values exhibit no or little difference between the two individual pH underlayers. The higher bloom acid ossein gelatins are significantly harder in comparison to the deionized limed ossein. The overall image wear, as described in Example 3, are better at pH 5.8. However, both pH's exhibit significant image wear improvements when the acid ossein gelatin is used and additionally, when the higher bloom strength is used.

What is claimed:

1. A process for producing a lithographic printing plate comprising the steps of imagewise exposing a single sheet lithographic plate material consisting of a flexible support, having thereon a) at least an underlayer containing an acid ossein gelatin having a viscosity before it is hardened of less than 40 cps at 60 degrees Centrigrade at 6 ⅔% weight/weight of gelatin and aqueous carrier wherein said acid ossein gelatin in solution has a pH of at least 7.1, b) a light sensitive silver halide layer, and c) a physical development nucleating surface layer, and, after said exposing, processing said plate material in a diffusion transfer developer or alkaline activator solution to develop imaged portions as hydrophilic areas and retain non-exposed areas as oleophilic areas on said plate.

2. The process of claim 1 wherein said acid ossein gelatin has an isoelectric point of 6.5 or greater.

3. The process of claim 1 wherein said acid ossein gelatin has a viscosity before it is hardened of greater than 20 cps and less than 40 cps at 60 degrees Centrigrade at 6 ⅔% weight/weight of gelatin to aqueous carrier.

4. The process of claim 2 wherein said acid ossein gelatin has a viscosity before it is hardened of greater than 20 cps and less than 40 cps at 60 degrees Centrigrade at 6 ⅔% weight/weight of gelatin to aqueous carrier.

5. The process of claim 1 wherein said acid ossein gelatin has an isoelectric point of 6.5 or greater.

6. A process for producing a lithographic printing plate comprising the steps of imagewise exposing a single sheet lithographic plate material consisting of a flexible support, having thereon a) at least an underlayer containing a hydrophilic colloid binder which consists essentially of an acid ossein gelatin having a viscosity before it is hardened of less than 40 cps at 60 degrees Centrigrade at 6 ⅔% weight/weight of gelatin and aqueous carrier wherein said acid ossein gelatin in solution has a pH of at least 7.1, b) a light sensitive silver halide layer, and c) a physical development nucleating surface layer, and, after said exposing, processing said plate material in a diffusion transfer developer or alkaline activator solution to develop imaged portions as hydrophilic areas and retain non-exposed areas as oleophilic areas on said plate.

7. The process of claim 6 wherein said acid ossein gelatin has a viscosity before it is hardened of greater than 20 cps and less than 40 cps at 60 degrees Centrigrade at 6 ⅔% weight/weight of gelatin and aqueous carrier.

8. The process of claim 6 wherein said acid ossein gelatin has an isoelectric point of 6.5 or greater.

9. The process of claim 6 wherein said acid ossein gelatin has a viscosity before it is hardened of greater than 20 cps and less than 40 cps at 60 degrees Centrigrade at 6 ⅔% weight/weight of gelatin to aqueous carrier.

10. The process of claim 7 wherein said acid ossein gelatin has an isoelectric point of 6.5 or greater.

11. A process for producing a lithographic printing plate comprising the steps of imagewise exposing a single sheet lithographic plate material consisting of a flexible support having thereon a) at least an underlayer having a gelatin binder consisting of acid ossein gelatin having a viscosity before it is hardened of less than 40 cps at 60 degrees Centigrade at 6 ⅔% weight to weight of gelatin and aqueous carrier wherein said acid ossein gelatin in solution has a pH of at least 7.1, b) a light sensitive silver halide layer, and c) a physical development nucleating surface layer, and, after said exposing, processing said plate material in a diffusion transfer developer or alkaline activator solution to develop imaged portions as hydrophilic areas and retain non-exposed areas as oleophilic areas on said plate.

12. The process of claim 11 wherein said acid ossein gelatin in solution has a pH of an isoelectric point of 6.5 or greater.

13. The process of claim 12 wherein said acid ossein gelatin has a viscosity before it is hardened of greater than 20 cps and less than 40 cps at 60 degrees Centigrade at 6⅔% weight to weight of gelatin to aqueous carrier.

* * * * *